United States Patent [19]

Hackley

[11] Patent Number: 4,903,086
[45] Date of Patent: Feb. 20, 1990

[54] VARACTOR TUNING DIODE WITH INVERSION LAYER

[75] Inventor: Lloyd W. Hackley, Seminole, Fla.

[73] Assignee: E-Systems, Inc., Dallas, Tex.

[21] Appl. No.: 296,862

[22] Filed: Jan. 13, 1989

Related U.S. Application Data

[63] Continuation of Ser. No. 145,211, Jan. 19, 1988, abandoned.

[51] Int. Cl.⁴ .............................................. H01L 29/92
[52] U.S. Cl. ...................................... 357/14; 357/52; 357/51; 357/53
[58] Field of Search ............... 357/52, 14, 52 E, 52 C, 357/52 T, 51, 53

[56] References Cited

U.S. PATENT DOCUMENTS

| | | | |
|---|---|---|---|
| 3,463,977 | 8/1969 | Grove et al. | 317/235 |
| 3,508,123 | 4/1970 | Liles | 317/234 |
| 3,539,880 | 11/1970 | Squire et al. | 357/14 X |
| 3,591,836 | 7/1971 | Booher | 357/14 X |
| 3,604,990 | 9/1971 | Sigsbee | 357/14 |
| 3,611,070 | 10/1971 | Engeler | 357/14 X |
| 3,624,895 | 12/1971 | MacIver et al. | 29/570 |
| 3,648,127 | 3/1972 | Lenzlinger | 317/235 |
| 3,648,340 | 3/1972 | MacIver | 29/25.42 |
| 3,840,306 | 10/1974 | Raabe et al. | 357/14 |
| 3,877,053 | 4/1975 | Kaplit | 357/14 X |
| 4,001,873 | 1/1977 | Kajiwara et al. | 357/59 |
| 4,003,009 | 1/1977 | Watanabe | 357/14 X |
| 4,226,648 | 10/1980 | Goodwin et al. | 148/175 |
| 4,529,995 | 7/1985 | Sakai et al. | 357/14 |

FOREIGN PATENT DOCUMENTS

| | | | |
|---|---|---|---|
| 53-132274 | 11/1978 | Japan | 357/14 |
| 56-4285 | 1/1981 | Japan | 357/14 X |
| 56-81977 | 7/1981 | Japan | 357/14 |
| 57-202787 | 11/1982 | Japan | 357/14 |
| 57-027787 | 12/1982 | Japan | 357/14 X |
| 60-245282 | 12/1985 | Japan | 357/14 X |
| 61-272963 | 12/1986 | Japan | 357/14 X |

OTHER PUBLICATIONS

Sah, "Effect of Surface Recombination and Channel on P-N Junction and Transistor Characteristics," Jan. 1962, pp. 94–108, IRE Transactions on Electron Devices.

Primary Examiner—William Mintel
Attorney, Agent, or Firm—Harold E. Meier

[57] ABSTRACT

The invention comprises a varactor tuning diode for use in a voltage controlled oscillator with a fast-hopping capability and short settling time for resonant frequency changes wherein the varactor tuning diode comprises an MOS structure with an oxide layer with thick and thin segments contiguous with and below the conductive metal layer, a permanently inverted P+ silicon area and a space-charge region terminating at the oxide layer a significant distance away from the planar PN junction such as to isolate the surface effects and bulk effect.

15 Claims, 2 Drawing Sheets

VARACTOR TUNING DIODE WITH INVERSION LAYER

CROSS-REFERENCE TO RELATED APPLICATIONS

This application is a continuation of application Ser. No. 145,211, filed Jan. 19, 1988, now abandoned.

TECHNICAL FIELD

The present invention relates to a varactor tuning diode for use in a voltage controlled oscillator to provide fast-hopping capabilities with short settling times for resonant frequency changes.

BACKGROUND AND SUMMARY

Voltage-controlled oscillators (VCO's) designed for rapid changes in the resonant frequency have a multitude of uses in the communications and computer industries. In a VCO, the resonant frequency is determined by the capacitance of the tuning diodes. This capacitance in turn varies with the voltage impressed across the planar PN junction.

In VCO's designed for rapid changes in the resonant frequency (fast hop capability), it is important that the circuits settle at the new frequency within a short period of time—in the order of milliseconds. VCO's using tuning diodes that have oxide passivated silicon PN junctions often suffer from slow settling times because of unwanted surface charge or positively charged ions near the PN interface in the silicon oxide.

Additionally, ionizing radiation aggravates the settling time problem seen in fast hop applications. Ionizing radiation causes a buildup of trapped positive charges in the oxide near the silicon surface which adds to unwanted charge often resulting from processing steps used in the manufacture of the varactor tuning diode.

The capacitance associated with a PN junction at a given bias voltage is determined by the width of the space-charge region. As the impressed voltage is increased in the reversed-biased mode, the space-charge region widens approximately as the square root of the voltage. The capacitance of the diode varies inversely with the width of the space-charge region.

VCO's include a control loop as a part of the total circuitry for maintaining this impressed voltage. In this control loop, as the frequency of oscillation approaches the new frequency, it is sampled and measured against the selected new frequency. The difference between the sampled frequency and the selected new frequency is converted to an "error" voltage, which iteratively adjusts the voltage across the tuning diode, eventually reaching the capacitance associated with the selected new frequency of oscillation. The elapsed time the control loop circuit requires to reach convergence when changing frequency f1 to frequency f2 (or from f2 to f1), where f1 is the lower frequency, is called settling time.

The problem is that unwanted mobile positive charge, bends the depletion region of the PN junction at the surface because of the negative "image charges", slightly altering the capacitance, and its associated frequency of oscillation.

It takes a relatively long time, in the order of milliseconds, for these mobile positive charges to be "swept" away by the electric field of the expanding space-charge region. This electric field alters the density of "surface states" and the amount of bending at the surface.

In addition, the capacitance associated with each new bias voltage iteration during a fast-hop changes with time, lagging the equilibrium capacitance slightly. This also delays the control loop in the VCO from converging upon f2 or f1. The result is an excessively long settling time.

In accordance with the present invention, a varactor tuning diode for use in a voltage controlled oscillator has a metal-oxide-silicon (MOS) structure that forces the space-charge region to terminate in the oxide layer a significant distance away from the planar PN junction.

The oxide over the planar PN junction is made thin enough so that a voltage bias on the metallization immediately above the thin oxide layer causes an inversion layer in the lightly-doped N-type silicon layer immediately underneath. The design and thickness of the oxide layer is determined by the lowest voltage imposed upon the tuning diode during operation of the VCO. This causes the area under the thin oxide layer to remain in an inverted state.

Although the PN junction in this invention does terminate at the surface like any planar junction and, as such, its space-charge region at that termination will be altered by the unwanted positive charge in the oxide; these surface states will not affect the VCO settling time.

The capacitance drift, which also slows the settling time, associated with the surface states has to be charged and discharged by the signal impressed across the tuning diode. The resistance of the inversion layer, from where it terminates at the oxide layer to the PN junction, is designated to be too high to allow effective charging and discharging. Therefore, the varactor tuning effect is controlled by bulk properties of the silicon, where dielectric relaxation constants are measured in picoseconds, rather than at the silicon surface where the relaxation time is measured in milliseconds. Thus, the settling time of the varactor tuning diode of this invention is faster than the prior art which used tuning diodes without this isolating structure.

In addition, a varactor tuning diode of the present invention significantly increases the tolerance of the tuning diode to ionizing radiation. Finally, a varactor tuning diode of the present invention enables the tuning diode to behave independently of the production history of oxide cleanliness—an advantage when using a VCO in fast-hop applications.

BRIEF DESCRIPTION OF THE INVENTION

A more complete understanding of the invention and its advantages will be apparent from the Detailed Description taken in conjunction with the accompanying drawings in which.

DETAILED DESCRIPTION

Figure 1:
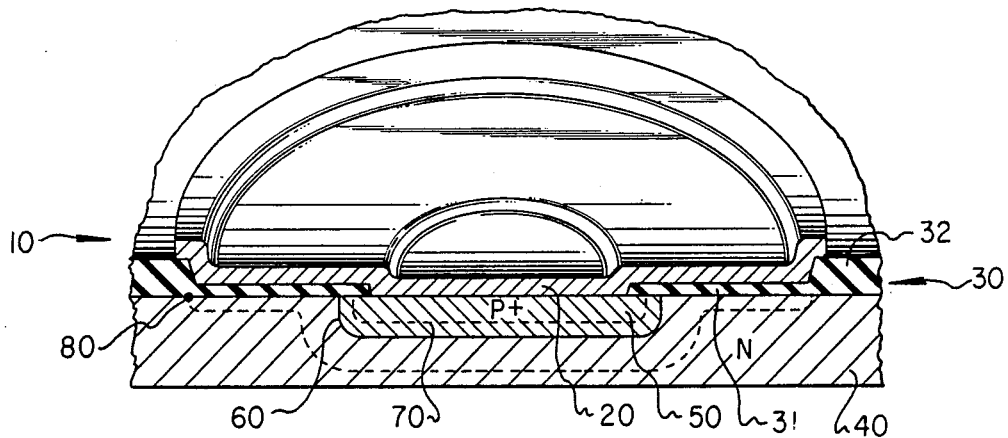
FIG. 1 is a cross section of the varactor tuning diode.

Referring initially to FIG. 1, there is shown a cross section of the varactor tuning diode 10, having an outside conductive metallic layer 20, which may be aluminum or any other metal with similar conductive properties.

Underneath and contiguous with the conductive metallic layer 20 is an oxide layer 30, which has both a first relatively thin segment 31 of a predetermined thickness and a second thicker segment 32. In one embodiment of the invention, the thickness of the oxide layer 30 at the first thin segment 31 may be between 800 and 1,500 Angstrom units. The design and thickness of the thin segment 31 of the oxide layer 30, however, is determined by the lowest voltage imposed upon the varactor tuning diode 10 in a voltage controlled oscillator application and by the highest conductivity allowed in the inversion layer without loss of the isolation between surface and bulk effects.

Beneath the oxide layer 30, is an N-type silicon layer 40, which functions as the substrate for the varactor tuning diode 10. Immediately below the thin segment of the oxide layer 30 and doped into the N-type silicon layer 40, is a permanently inverted P+ silicon area 50.

At the junction of the permanently inverted P+ silicon area 50, disposed in the N-type silicon layer 40, is a planar PN junction 60. Disposed partially in the P+ silicon area 50 and partially in the N-type silicon layer 40, encompassing the planar PN junction 60 is a space charge region 70.

The space charge region 70 terminates at a point 80 on the oxide layer 30 at a distance from the planar PN junction 60 so as to avoid the capacitance drift effect.

Figure 2:
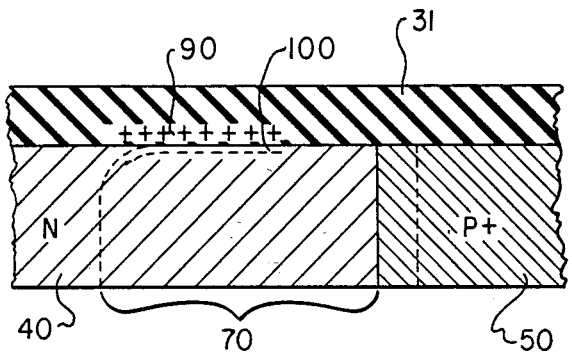
FIG. 2 is an expanded view of the cross section of FIG. 1 at the planar PN junction and surrounding area of the varactor tuning diode.

Now referring to FIG. 2, there is shown an expanded view of the planar PN junction 60 of FIG. 1 and the surrounding area of the varactor tuning diode 10 including the first thin segment 31 of the oxide layer 30, N-type silicon layer 40, P+ silicon area 50, planar PN junction 60 and space charge region 70. FIG. 2 further illustrates one of the problems with the prior art in that it reveals the mobile positive charges 90, and corresponding negative image charges 100, which cause the long settling times when going from one resonant frequency to another. It takes a relatively long time, in the order of milliseconds, for these mobile positive charges 90 to be swept away by the expanding space charge region 70. These mobile positive charges 90 and negative image charges 100, taken together form an electric field, which alters the density of and amount of bending at the surface of the thin segment 31 of the oxide layer 30.

The capacitance of the varactor of FIG. 2 associated with each new bias voltage iteration during a fast hop changes with time, lagging the equilibrium capacitance slightly. This delays the voltage controlled oscillator from converging from one resonant frequency to another and causes an excessively long settling time.

Figure 3:
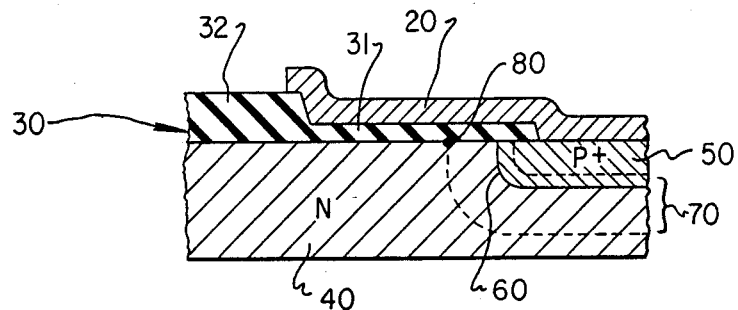
FIG. 3 is a schematic representation of the invention when there is no voltage bias on the metallic layer above the oxide layer.
Figure 4:
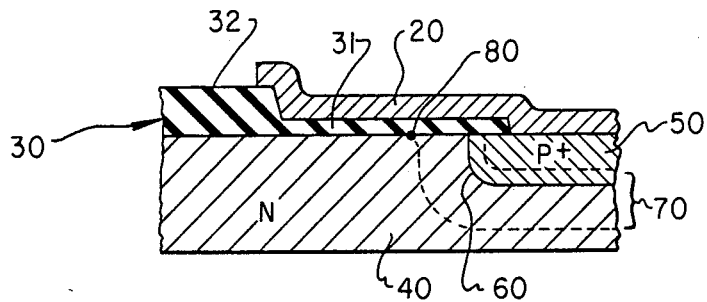
FIG. 4 is a schematic representation of the invention when there is a low voltage bias on the metallic layer above the oxide layer.
Figure 5:
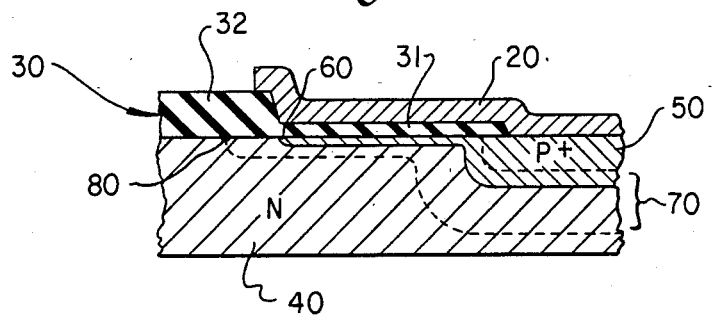
FIG. 5 is a schematic representation of the invention at a high voltage bias on the metallic layer above the oxide layer.

FIGS. 3 through 5 illustrate the structure and function of the invention at different voltage bias levels.

FIG. 3 illustrates a schematic varactor tuning diode 10, when there is no bias voltage. Shown therein, is the outside conductive metallic layer 20, the thin segment 31 and thick segment 32 of the oxide layer 30, the N-type silicon layer 40, the permanently inverted P+ silicon area 50, the planar PN junction 60, the space charge region 70 and the point 80 at the oxide layer 30 where the space charge region 70 terminates.

At zero bias voltage, the planar PN junction 60 has a built-in space charge region 70 which terminates at point 80 on the thin segment 31 of the oxide layer 30. There is no induced inversion layer because there is no electrical field between the conductive metallic layer 20 and the N-type silicon layer 40.

FIG. 4 illustrates a schematic of the varactor tuning diode 10 at a low bias voltage. Again shown therein, is the outside conductive metallic layer 20, the thin segment 31 and thick segment 32 of the oxide layer 30, the N-type silicon layer 40, the permanently inverted P+ silicon layer 50, the planar PN junction 60, the space charge region 70 and the point 80 at the thin segment 31 of the oxide layer 30 where the space charge region 70 terminates.

Here, the space charge region 70 has expanded slightly in comparison to FIG. 3 to accommodate the low voltage impressed on the planar PN junction 60. No induced inversion layer exists because the amount of negative image charge 100 induced by the electric field does not overcome the donor ions that are contained in the N-type silicon layer 40.

FIG. 5 illustrates a schematic of the varactor tuning diode 10 at a higher bias voltage than in FIG. 4.

Again shown therein, is the outside conductive metallic layer 20, the thin segment 31 and thick segment 32 of the oxide layer 30, the N-type silicon layer 40, the permanently inverted P+ silicon layer 50, the planar PN junction 60, the space charge region 70 and the point 80 at the thick segment 32 of the oxide layer 30 where the space charge region 70 terminates.

As the bias voltage increases, the electric field which exists across the first thin segment 31 of the oxide layer 30 induces enough positive charge to slightly overcome the fixed negatively charged donor ions at the surface of the thin segment 31 of the oxide layer 30. This changes the conductivity type to P− at the surface of the thin segment 31 of the oxide layer 30 and causes an inversion layer shown by the expanding upper segment of the space charge region 70.

Thus, the point 80 at the thick segment 32 of the oxide layer 30, where the space charge region 70 terminates, is even further from the planar PN junction 60 than in the other figures. The inversion layer shown has a very high radial resistance. The time constant associated with charging and discharging the surface capacitance at point 80 is too long for the resonant frequency to modulate. Consequently, any radiation induced charge at point 80 will not delay the settling time of the voltage controlled oscillator, which is now controlled by the bulk effects of the silicon layer 40.

While certain embodiments of the present invention have been described in detail herein and shown in the accompanying Drawings, it will be evident that further modifications are possible without departing from the scope of the invention.

I claim:

1. A varactor tuning diode with fast-hopping capability and a decreased settling time for resonant frequency changes comprising:
   (a) a conductive metallic layer overlaying an oxide layer and a permanently inverted P+ silicon area for receiving a bias voltage;
   (b) said oxide layer contiguous with and immediately below the conductive metallic layer such that the thickness of the oxide layer is predetermined by the lowest voltage imposed upon the varactor tuning diode by the voltage controlled oscillator for the purpose of transmitting said bias voltage across the conductive metallic layer to the N-type silicon layer below the conductive metallic layer and the oxide layer;

(c) an N-type silicon layer contiguous with the oxide layer;

(d) a permanently inverted P+ silicon area being doped into the N-type silicon layer immediately below the conductive metallic layer and the leading edge of the the oxide layer;

(e) a planer PN junction disposed in the N-type layer at the P+ silicon area and N-type silicon layer interface; and (f) a space charge region disposed partially in the P+ silicon area and partially in the N-type silicon layer, encompassing the planer PN junction, said space charge region being expanded along the upper surface of the N-type silicon layer by the application of said bias voltage so as to terminate at the oxide layer at a distance from the planer PN junction sufficient to avoid the capacitance drift effect.

2. A varactor tuning diode having a fast-hopping capability and decreased settling times for resonant frequency changes, comprising:

(a) a PN junction formed by doping a permanently inverted P+ silicon area into an N-type silicon layer;

(b) an oxide layer less than 1500 Angstrom units in thickness contiguous with and overlaying the N-type silicon layer;

(c) a conductive metallic layer overlaying and contiguous with the permanently inverted P+ silicon area and the oxide layer such that, for all bias voltages within a predetermined range of bias voltages, application of a bias voltage to the conductive metallic layer causes an expanded inversion layer extending in all radial directions from the PN junction along the surface of the N-type silicon layer, the expanded inversion layer having a sufficiently high radial resistance so as to prevent capacitance drift and to decrease settling times.

3. A varactor tuning diode in accordance with claim 2, wherein the conductive metallic layer is a refractory metal.

4. A varactor tuning diode in accordance with claim 2, wherein the thickness of the oxide layer immediately above the outer edge of the P+ silicon area is determined by the lowest voltage imposed upon the varactor tuning diode by the voltage controlled oscillator and by the highest conductivity allowed in the inversion layer.

5. A varactor tuning diode in accordance with claim 2 wherein the oxide layer is of a predetermined thickness for the purpose of transmitting the bias voltage across the conductive metallic layer to the N-type silicon layer immediately below and contiguous with the conductive metallic layer and the leading edge of the thin segment of the oxide layer to cause said expanded inversion layer.

6. A varactor tuning diode in accordance with claim 1, wherein the conductive metallic layer is a refractory metal.

7. A varactor tuning diode with fast-hopping capability and reduced settling time for resonant frequency changes in a high radiation environment, and that has been exposed to a radiation environment, comprising:

(a) a conductive metallic layer overlaying an oxide layer and a P+ silicon area for receiving a bias voltage;

(b) said oxide layer being less than 1500 Angstrom units in thickness and contiguous with and immediately below the conductive metallic layer and partially overlaying the P+ silicon area;

(c) an N-type silicon layer contiguous with the oxide layer;

(d) a permanently inverted P+ silicon area doped into the N-type silicon layer and immediately below the conductive metallic layer and partially below the leading edge of the oxide layer to form a PN junction;

(e) said oxide layer enabling said bias voltage applied to said conductive metallic layer to cause an expanded inversion layer in said N-type silicon layer which terminates at a point on said oxide layer sufficiently distant from the PN junction to cause a sufficiently high radial resistance in the inversion layer to prevent capacitance drift and to decrease settling times.

8. A varactor tuning diode in accordance with claim 7, wherein the conductive metallic layer is a refractory metal.

9. A varactor tuning diode in accordance with claim 7, wherein the thickness of the oxide layer immediately above the outer edge of the P+ silicon area is determined by the lowest voltage imposed upon the varactor tuning diode by the voltage controlled oscillator.

10. A varactor tuning diode in accordance with claim 7, wherein the oxide layer is of a predetermined thickness for the purpose of transmitting the voltage bias across the conductive metallic layer to the N-type silicon layer immediately below and contiguous with the conductive metallic layer and the leading edge of the thin segment of the oxide layer to cause said expanded inversion layer.

11. A varactor tuning diode comprising:

a first semiconductive region of first-type conductivity;

a second semiconductive region of second-type conductivity extending from a portion of one surface of said first semiconductive region to a predetermined depth, so as to form a junction between said first and second semiconductive regions; and an insulating layer overlaying the surface of said first semiconductive region such that a bias voltage exceeding a predetermined level applied to said second semiconductive region and across said insulating layer induces an expanded inversion layer of second-type of conductivity on the surface of said first semiconductive region, said expanded inversion layer having a radial resistance sufficient to inhibit signals impressed on the diode from modulating charge associated with the surface state of said first semiconductive region beyond the point to which said expanded inversion layer extends, further comprising a metallic conductive layer overlaying and contiguous with said insulating layer and contacting said second semiconductor region to which the bias voltage is applied.

12. The varactor tuning diode of claim 11 wherein said induced inversion layer's conductivity does not cause a loss of isolation between surface and bulk effects of the varactor tuning diode.

13. The varactor tuning diode according to claim 11 wherein said semiconductive region of first-type conductivity is comprised of N-type silicon and said semiconductive region of second-type conductivity is comprised of permanently inverted P+ silicon doped into said N-type silicon.

14. In a varactor tuning diode having an N-type silicon region, a P-type silicon region, a PN junction an oxide layer overlaying the N-type silicon area, and a conductive metallic layer overlaying and contiguous with the oxide layer and the P-type silicon region, a method to prevent capacitance drift and to decrease settling times associated with resonant frequency changes comprising the application of a bias voltage signal, having a voltage level within a predetermined range of voltage levels, to the metallic layer so as to induce a P− inversion layer along the surface of the N-type silicon area that extends radially in all directions parallel to the surface of the N-type silicon region from the PN junction to a point on the oxide layer far enough from the PN junction to prevent capacitive drift and decrease settling time for all predetermined resonance frequencies when the bias voltage signal is applied.

15. A varactor tuning diode with fast-hopping capability and short settling times for resonance frequency changes comprising:

(a) a PN junction formed by doping a permanently inverted P+ silicon area into an N-type silicon layer;
(b) a first segment of an oxide layer, having a thickness of less than 1500 Angstrom units, that partially overlays and is contiguous with the N-type silicon area and extends, in all radial directions, predetermined distances from the PN junction;
(c) a second segment of the oxide layer, having a thickness greater than the first segment, that overlays and is contiguous with the N-type silicon layer beyond, in all radially directions from the PN junction, the first segment of the oxide layer; and
(d) a conductive metallic layer overlaying and contiguous with the permanently inverted P+ silicon layer and the first segment of the oxide layer such that, for all bias voltages within a predetermined range of bias voltages, application of a bias voltage to the conductive metallic layer causes an expanded inversion layer extending in all radial directions from the PN junction along the surface of the N-type silicon layer, the expanded inversion layer having a sufficiently high radial resistance so as to prevent capacitance drift and to decrease settling times.

* * * * *